(12) United States Patent  (10) Patent No.: US 9,173,307 B2
Lee et al.  (45) Date of Patent: Oct. 27, 2015

(54) RACK SYSTEM FOR POWER STORAGE BATTERY MODULES

(71) Applicant: LG CHEM, LTD., Seoul (KR)

(72) Inventors: Bum-Hyun Lee, Seoul (KR); Mi-Jung Park, Seoul (KR)

(73) Assignee: LG CHEM, LTD., Seoul (KR)

( * ) Notice: Subject to any disclaimer, the term of this patent is extended or adjusted under 35 U.S.C. 154(b) by 97 days.

(21) Appl. No.: 13/948,902

(22) Filed: Jul. 23, 2013

(65) Prior Publication Data

US 2013/0313953 A1 Nov. 28, 2013

Related U.S. Application Data (63) Continuation of application No. PCT/KR2012/003176, filed on Apr. 25, 2012.

(30) Foreign Application Priority Data

Apr. 25, 2011 (KR) .................. 10-2011-0038399

(51) Int. Cl.
*H01M 2/02* (2006.01)
*H05K 5/02* (2006.01)
*H01M 2/10* (2006.01)
*H05K 7/20* (2006.01)

(52) U.S. Cl.
CPC .......... *H05K 5/0213* (2013.01); *H01M 2/1077* (2013.01); *H05K 5/0221* (2013.01); *H05K 7/20* (2013.01)

(58) Field of Classification Search
CPC ................................... H01M 2/1077
USPC ......................................... 429/99
See application file for complete search history.

(56) References Cited

U.S. PATENT DOCUMENTS 6,224,998 B1   5/2001 Brouns et al.
6,782,605 B1   8/2004 Stocchiero
(Continued)

FOREIGN PATENT DOCUMENTS

CA    1297447 C     2/1988
EP    0 303 650 A1  2/1989
(Continued)

OTHER PUBLICATIONS

PCT/ISA/210—International Search Report mailed on Nov. 26, 2012, issued in PCT/KR2012/003176.
(Continued)

*Primary Examiner* — Stewart Fraser
*Assistant Examiner* — Olatunji Godo
(74) *Attorney, Agent, or Firm* — Birch, Stewart, Kolasch & Birch, LLP (57) ABSTRACT

A rack system for power storage battery modules according to the present disclosure includes a rack assembly configured in the form capable of defining an entire accommodation area, where a plurality of battery modules are accommodated in a multi-stage form; and a plurality of rail frames coupled to the multi stages of the rack assembly to support edges of the bottom surface of the battery modules, wherein each of the battery modules has a bottom surface on which rail fixing parts are provided corresponding to the longitudinal direction of the rail frames and have an elastic coupling projection at a location contacting the rail frames, and when the battery modules are installed, the battery modules are pressured toward the rail frames in a vertical direction to couple the rail fixing parts to the rail frames.

10 Claims, 5 Drawing Sheets

(56) References Cited

U.S. PATENT DOCUMENTS

| | | |
|---|---|---|
| 2002/0086202 A1 | 7/2002 | Stone et al. |
| 2006/0286441 A1* | 12/2006 | Matsuoka et al. ............... 429/99 |
| 2008/0057393 A1* | 3/2008 | Onuki et al. .................. 429/159 |
| 2008/0063934 A1 | 3/2008 | Bechtold et al. |
| 2008/0213652 A1 | 9/2008 | Scheucher |
| 2008/0217209 A1 | 9/2008 | Shimoyama |

FOREIGN PATENT DOCUMENTS

| | | |
|---|---|---|
| EP | 0 779 668 A1 | 6/1997 |
| GB | 2 062 947 A | 5/1981 |
| JP | 3-152858 A | 6/1991 |
| JP | 05-159755 A | 6/1993 |
| KR | 20-0193346 Y1 | 8/2000 |
| KR | 10-2002-0043240 A | 6/2002 |
| KR | 10-2003-0038773 A | 5/2003 |

OTHER PUBLICATIONS

PCT/ISA/237—mailed on Nov. 26, 2012, issued in PCT/KR2012/003176.

* cited by examiner

RACK SYSTEM FOR POWER STORAGE BATTERY MODULES

CROSS-REFERENCE TO RELATED APPLICATION

The present application is a continuation of International Application No. PCT/KR2012/003176 filed on Apr. 25, 2012, which claims priority to Korean Patent Application No. 10-2011-0038399 filed in the Republic of Korea on Apr. 25, 2011, the disclosures of which are incorporated herein by reference.

TECHNICAL FIELD

The present disclosure relates to a rack system for power storage battery modules, and more particularly, to a rack system for power storage battery modules, which allows easy assembly of unit battery modules and improved cooling efficiency in a high-voltage and large-capacity power storage system required for establishing a power network such as a smart grid or a power storage system for power backup, industry use, or home use.

BACKGROUND ART

Generally, a smart grid is seen as a next-generation power network which applies information technology (IT) to the existing power system so that a smart grid observes and controls a power network in real time and optimizes the operation efficiency of the power network through the bidirectional communication between power providers and consumers. In addition, a smart grid can be used in association with new electric equipments that are recently in great demand, such as a renewable energy generation system or a charge system for electric vehicles, and can improve power utilization efficiency by providing consumers' power usage information in real time, thereby decreasing unnecessary investment in power facilities and emission of greenhouse gases. Recently, smart grids have gained much attention due to issues of the modernization of a power network and the expansion of a renewable energy which have led to the extensive research of a smart grid.

One of the key technologies in relation to a smart grid is a power storage system. A power storage system provides load leveling by storing electric power during off-peak periods and using the stored power during on-peak periods, thereby contributing to the efficient use of power equipments. Conventionally, a pumped-storage power generation, which converts nocturnal surplus power into kinetic energy of water and saves the kinetic energy, and a chemical energy storage method, which combines multiple lead-acid battery cells to each other in series or in parallel, were commonly used.

However, a pumped-storage power generation absorbs enormous construction costs, since it requires large quantities of water and particular geographical conditions. In the case of a lead-acid battery cell, due to low energy storage density, a high-voltage and large-capacity power storage system cannot be established. Meanwhile, with the development of a lithium-ion battery having high energy density, a high-voltage and large-capacity power storage system by using a chemical energy storage method is now possible.

A power storage system using a chemical energy storage method includes battery modules configured with lithium ion batteries having high energy density, and a predetermined number of the battery modules are electrically connected to each other and loaded in a rack system with a multi-stage form.

In order to load battery modules, a rack system should maintain certain temperature and humidity; be ventilated well; and facilitate easy maintenance and repair.

A conventional rack system of a power storage system where battery modules are loaded will be explained below with reference to the accompanying drawings.

Figure 1:
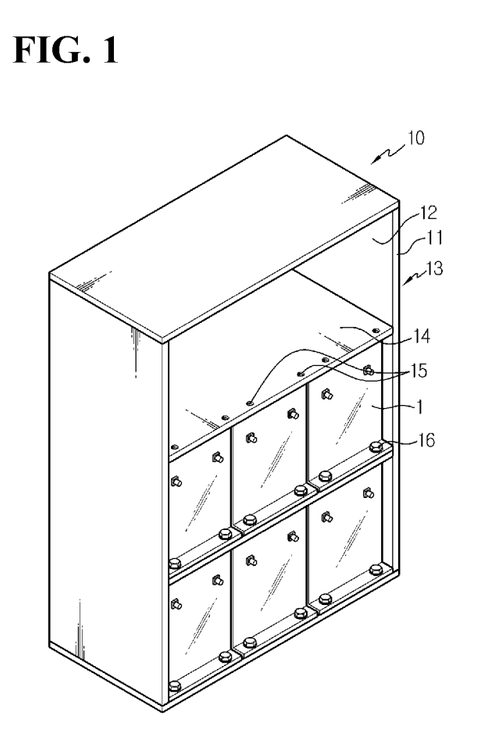
FIG. 1 is a schematic perspective view showing a conventional rack system for battery modules.

FIG. 1 is a schematic perspective view showing a conventional rack system of battery modules.

As shown in FIG. 1, the conventional rack system 10 includes a rack assembly 13 having frames 11 and panels 12, and a plurality of shelves 14 on which a predetermined number of battery modules 1 are installed in a multi-stage form. The plurality of shelves 14 are fixed to the frames 11 of the rack assembly 13 to have a multi-stage form.

In the conventional rack system 10, since the bottom of each battery module 1 directly contacts the shelf 14, the bottom of the battery modules 1 cannot ventilate. Also, in the conventional rack system 10, the battery module 1 is positioned to match a coupling hole 15 formed in the shelf 14 and the battery module 1 is fixed with the shelf 14 by using a coupling member 16 such as a bolt. However, such a structure requires space expansion, and the assembly of such a conventional rack system 10 is inconvenient.

DISCLOSURE

Technical Problem

The present disclosure is designed in consideration of the problems of the prior art, and therefore it is an object of the present disclosure to provide a rack system for power storage battery modules, which may allow battery modules to be easily assembled in a rack system and ensure an air path through the bottom surfaces of the battery modules.

Technical Solution

In order to accomplish the above object, the present disclosure provides a rack system for power storage battery modules, including a rack assembly configured in the form capable of defining an entire accommodation area, where a plurality of battery modules are accommodated in a multi-stage form; and a plurality of rail frames coupled to the multi-stages of the rack assembly to support edges of the bottom surface of the battery modules, wherein each of the battery modules has a bottom surface on which rail fixing parts are provided corresponding to the longitudinal direction of the rail frames and have an elastic coupling projection at a location contacting the rail frames, and when the battery modules are installed, the battery modules are pressured toward the rail frames in a vertical direction to couple the rail fixing parts to the rail frames.

Preferably, each of the rail fixing parts of the battery modules is coupled to each of the rail frames by means of snap-fitting.

Preferably, the rack assembly and the rail frames define an accommodation area used for accommodating battery modules in a multi-stage form and having an open side, and the battery modules snap-fitted with the rail frames are detachable through the open side of each stage.

Preferably, the rail fixing parts of the battery modules may be disposed between the rail frames and have a structure in which the coupling projection protrudes outwards, and the rail fixing parts of the battery module may be disposed at the outside of the rail frames and have a structure in which the coupling projection protrudes inwards.

Preferably, each of the rail frames has a groove concaving inwards, and the coupling projection of the rail fixing parts of the battery modules is sized to insert into the groove of each rail frame.

Preferably, the rack assembly includes a plurality of vertical rack frames respectively elongated in a vertical direction at four corners of the rack assembly to define an entire accommodation area of the battery modules; and panels attached to the outside of the vertical rack frames, wherein edges of each of the rail frames are respectively fixed to the vertical rack frames so that the rail frames have a multi-stage form.

Alternatively, the rack assembly further includes a plurality of horizontal rack frames respectively coupled to the right and left vertical rack frames in a multi-stage form to define the height of each stage for loading the battery modules, wherein edges of each of the rail frames are respectively fixed to the horizontal rack frames so that the rail frames have a multi-stage form.

Preferably, the bottom surface of the edges of each rail frame is respectively fixed to the horizontal rack frames, and the horizontal rack frames support a battery module so that battery modules accommodated in a multi-stage form may not be detached through the open side.

Preferably, each of the battery modules has a ventilating slot which allows air to flow between the top and bottom surfaces thereof.

Advantageous Effects

According to the present disclosure, since a rack system includes a rail-shaped shelf, battery modules may be easily assembled in the rack system without using a separate coupling member. Also, without expanding the space of the rack system, an airflow path may be ensured through the bottom surfaces of battery modules. That is, the space may be optimally utilized with high cooling efficiency of battery modules, thereby increasing stability and reliability of a power storage system, which adopts power storage battery modules.

DESCRIPTION OF DRAWINGS

Other objects and aspects of the present disclosure will become apparent from the following descriptions of the embodiments with reference to the accompanying drawings in which.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 2:
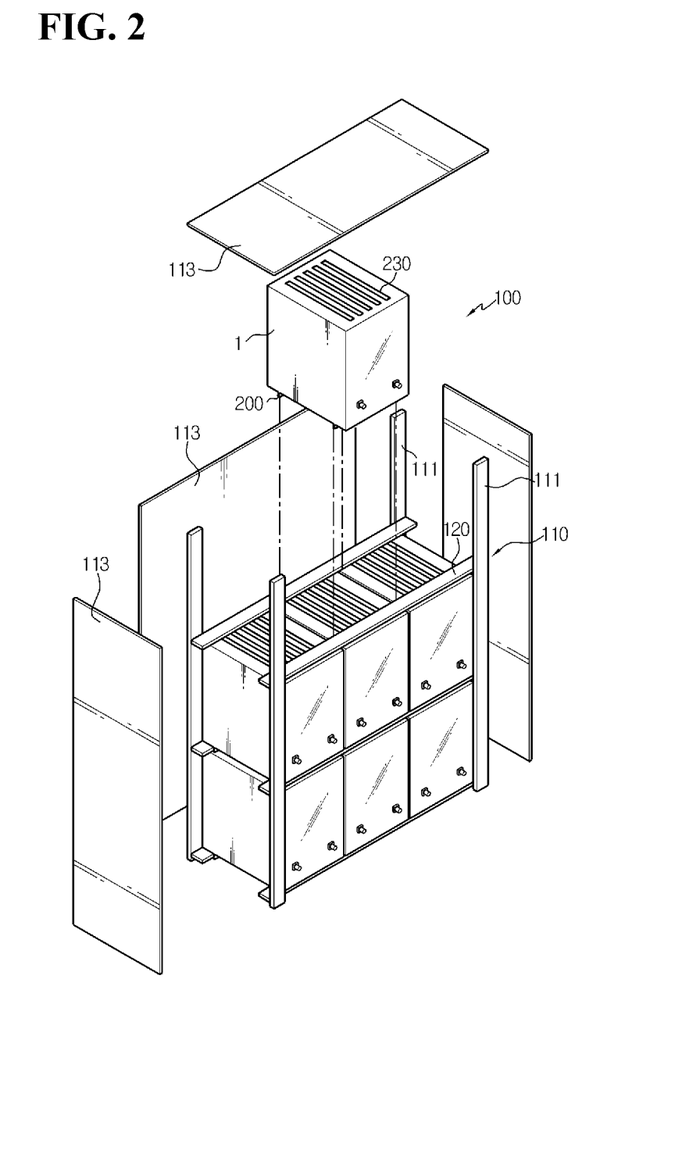
FIG. 2 is an exploded perspective view showing a rack system for power storage battery modules according to a first embodiment of the present disclosure.
Figure 3:
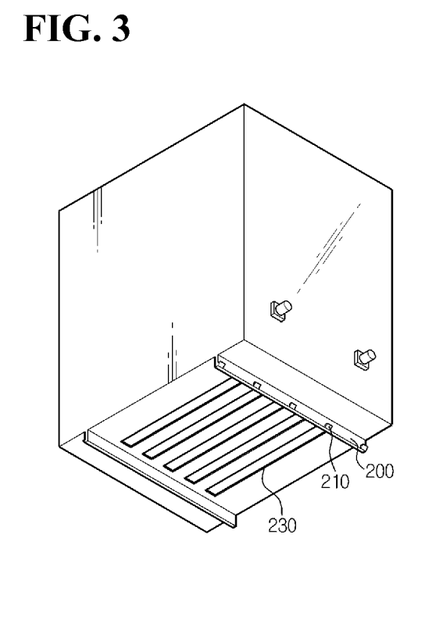
FIG. 3 is a bottom perspective view showing the bottom surface of the battery module of FIG. 2.
Figure 4:
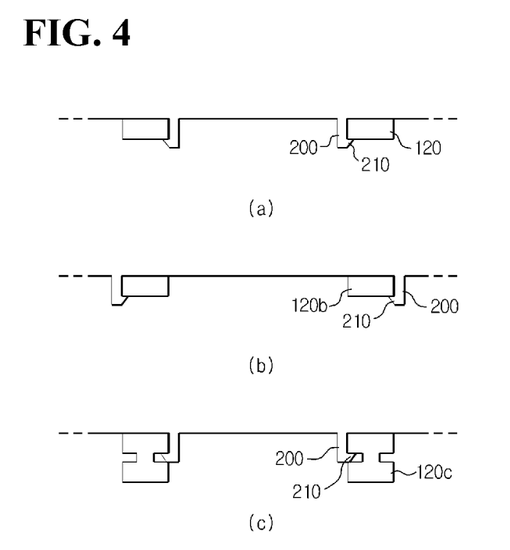
FIG. 4 are partial cross-sectional views showing various embodiments of rail frames of FIG. 2 and battery modules installed on the rail frames.
Figure 5:
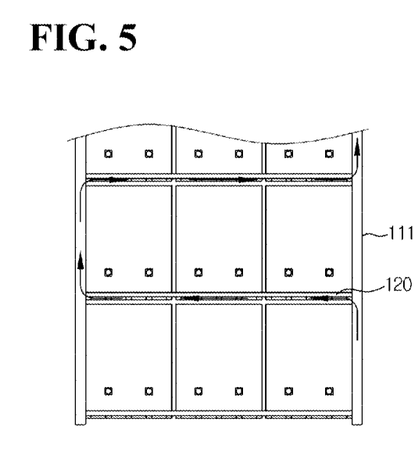
FIG. 5 is a view showing an airflow path in a rack system for power storage battery modules according to the present disclosure.

FIG. 2 is an exploded perspective view showing a rack system for power storage battery modules according to a first embodiment of the present disclosure; FIG. 3 is a bottom perspective view showing the bottom surface of the battery module of FIG. 2; FIG. 4 are partial cross-sectional views showing various embodiments of rail frames of FIG. 2 and battery modules installed on the rail frames; and FIG. 5 is a view showing an airflow path in a rack system for power storage battery modules according to the present disclosure.

Referring to FIG. 2, the rack system 100 for power storage battery modules according to the first embodiment of the present disclosure includes a rack assembly 110 configured in the form capable of defining an entire accommodation area, where a plurality of battery modules 1 are accommodated in a multi-stage form; and a plurality of rail frames 120 coupled to the multi stages of the rack assembly 110 to support edges of the bottom surface of the battery modules 1.

Meanwhile, although not shown in FIG. 2, the rack system 100 may further include a cooling device for cooling the battery modules 1, lines for electrically connecting the battery modules 1 with one another, and a controller for performing a charge or discharge action and a protection action of each battery module 1.

The present disclosure is characterized to have a coupling structure between the rack system 100 and the battery modules 1, so details regarding the component not shown in FIG. 2 will not be described herein.

The rack assembly 110 includes a plurality of vertical rack frames 111 respectively elongated in a vertical direction at four corners of the rack assembly 110 to define an entire accommodation area of the battery modules 1, and in order to make the rail frames 120 have a multi-stage form, edges of the rail frame 120 are respectively fixed to the vertical rack frames 111.

Also, the rack assembly 110 and the rail frames 120 define an accommodation area used for accommodating battery modules 1 in a multi-stage form and having an open side, and at least one battery module 1 is loaded in each stage.

Meanwhile, in order to protect the battery modules 1 loaded in the rack assembly 110, the rack assembly 110 may be coupled with panels 113, which are attached to the outside of the vertical rack frame 111 to form the appearance of the rack system 100.

The battery module 1 includes a plurality of battery rechargeable cells as an electric power storage unit, and the battery cells are electrically connected to each other. A battery cell includes an electric double layer capacitor having an ultra capacitor, or a secondary battery such as a lithium ion battery, a lithium polymer battery, a Ni—Cd battery, a Ni—MH battery, a Ni—Zn battery, or the like.

Referring to FIG. 3, the battery module 1 includes rail fixing parts 200 at the bottom surface thereof. The rail fixing parts 200 are provided corresponding to the longitudinal direction of the rail frames 120 and have a wedge-shaped coupling projection 210 made of an elastic material at a location contacting the rail frame 120. In this configuration, when the battery modules 1 are installed, the battery modules are pressured toward the rail frames 120 in the vertical direction to couple the rail fixing parts 200 to the rail frames 120 by means of snap-fitting. Also, a battery module 1 has a ventilating slot 230 so that air may flow between the top and bottom surfaces thereof, thereby giving an airflow channel allowing air circulation in each battery module 1. The plurality of battery cells included in the battery module 1 are installed in a cell receiving region (not shown) provided between adjacent ventilating slots 230. The heat generated from the cells in the cell receiving region may be transferred to the air which flows through the ventilating slot 230.

Meanwhile, the coupling between the rail fixing parts 200 of the battery modules 1 and the rail frames 120 may have a structure in which the rail fixing parts 200 are disposed between a pair of rail frames 120 and the coupling projection 210 protrudes outwards (FIG. 4a), or a structure in which the rail fixing parts 200 are disposed at the outside of a pair of the rail frames 120 and the coupling projection 210 protrudes inwards (FIG. 4b), or a structure in which rail frames 120c having a groove concaving inwards are adopted and the coupling projection 210 of the rail fixing parts 200 is formed to insert into the groove of the rail frame 120c (FIG. 4c). However, the present disclosure is not limited to the arrangement of the rail fixing parts and the shape of the coupling projection of the battery modules shown in FIG. 4, and thus it is obvious that various modifications may be applied thereto.

In the present disclosure, the rail fixing parts 200 of the battery module 1 are coupled to the rail frames 120 by means of snap fitting, the battery module 1 is not detached even though the battery module 1 is pulled out in a direction opposite to the coupling direction. Therefore, the battery modules 1 may be assembled with the rack system 100 without using a coupling member separately. Meanwhile, in order to detach the battery modules 1 from the rack system 100, the battery module 1 may be slid right or left on the rail frames 120 so that the battery module 1 is detached through the open sides located at the ends of the rail frames 120. At this time, while the battery modules 1 are kept in a fixed state, it is preferred to separately use a mean for fixing the battery modules 1, in order to support the battery modules 1 placed at the side ends of the rail frames 120 so that the battery module does not detach from the accommodation area through the open sides.

Referring to FIG. 5, the present disclosure may ensure an airflow path through the bottom surfaces of battery modules 1. The airflow path works for efficiently cooling the battery modules 1 along with the ventilating slot 230 formed in the top and bottom portions of the battery modules 1. Also, the airflow path may be ensured without expanding a separate space apart from the frame members for loading the battery modules 1.

Figure 6:
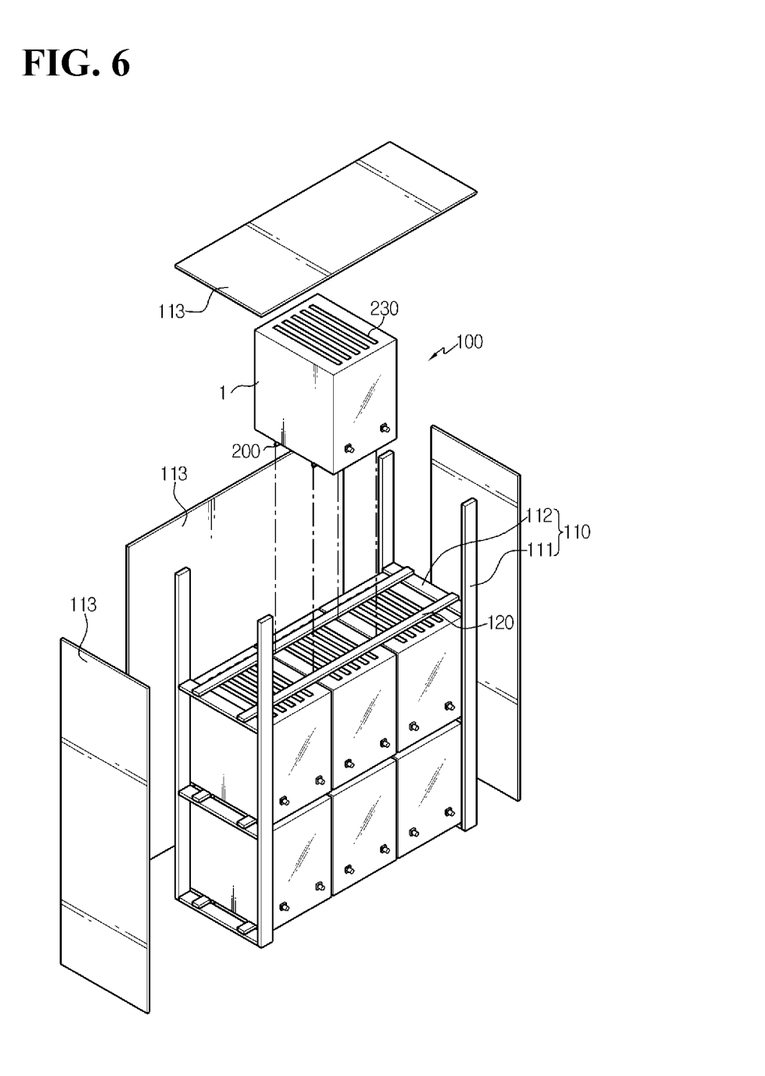
FIG. 6 is an exploded perspective view showing a rack system for power storage battery modules according to a second embodiment of the present disclosure.

FIG. 6 is an exploded perspective view showing a rack system for power storage battery modules according to a second embodiment of the present disclosure.

Referring to FIG. 6, the rack system 100 for power storage battery modules according to the second embodiment of the present disclosure further includes a plurality of horizontal rack frames 112. The horizontal rack frames 112 are respectively coupled in pairs to both right and left sides of the vertical rack frames 111 in a multi-stage form to define the height of each stage of the battery modules 1, in addition to the frame members included in the rack assembly 110.

The horizontal rack frames 112 are respectively fixed to the bottom edge of the rail frame 120 so that the rail frames 120 have a multi-stage form. Also, the horizontal rack frames 112 support the battery modules 1 disposed in each stage of the accommodation area so that the battery module may not detach through the open side. To achieve this, after the battery modules 1 are loaded on the bottom shelf, the horizontal frame 112 is placed at the top of the battery modules 1 loaded at the bottom shelf, and the horizontal frame 112 is height-adjusted or assembled to prevent the detachment of the battery module. By using the same method as described above, every stage of the accommodation area are sequentially filled with battery modules 1, and thus, all battery modules 1 may be loaded in the rack system 100.

The rack system according to the present disclosure may be applied to all sorts of power systems, such as a power storage system for a smart grid, a power storage system for industry use, home use, energy charge station use, etc., a power storage system for backup use, or the like.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A rack system for power storage battery modules, comprising;
    a plurality of battery modules;
    a rack assembly configured to define a multi-stage area in a vertical direction and accommodate the plurality of battery modules in each stage of the multi-stage area; and
    a plurality of rail frames coupled to each stage of the multi-stage area, thereby vertically supporting the battery modules,
    wherein rail fixing parts elongated in parallel along a longitudinal direction of the rail frames protrude downwardly from a bottom surface of the battery modules, and
    wherein an elastic coupling projection is formed at an end of each of the rail fixing parts to couple the rail fixing parts to the rail frames.

2. The rack system for power storage battery modules according to claim 1, wherein each of the rail fixing parts of the battery modules is coupled to each of the rail frames by means of snap-fitting.

3. The rack system for power storage battery modules according to claim 2, wherein the rack assembly and the rail frames define the multi-stage area used for accommodating the battery modules in a multi stage form and have an open side, and
    wherein the battery modules are detachable through the open side of each stage of the multi-stage area.

4. The rack system for power storage battery modules according to claim 2, wherein the rail fixing parts of the battery modules are disposed between the rail frames and have a structure in which the elastic coupling projections protrude outwards.

5. The rack system for power storage battery modules according to claim 2, wherein the rail fixing parts of the battery modules are disposed at the outside of the rail frames and have a structure in which the elastic coupling projections protrude inwards.

6. The rack system for power storage battery modules according to claim 4, wherein each of the rail frames has a groove concaving inwards, and the elastic coupling projections are sized to be inserted into the groove of each rail frame.

7. The rack system for power storage battery modules according to claim 1, wherein the rack assembly includes:
a plurality of vertical rack frames respectively elongated in a vertical direction at four corners of the rack assembly; and
panels attached to an outside of the vertical rack frames,
wherein edges of each of the rail frames are respectively fixed to the vertical rack frames.

8. The rack system for power storage battery modules according to claim 7, wherein the rack assembly further includes:
a plurality of horizontal rack frames respectively coupled to the vertical rack frames to define a height of each stage of the multi-stage area,
wherein edges of each of the rail frames are respectively fixed to the horizontal rack frames.

9. The rack system for power storage battery modules according to claim 8, wherein a bottom surface of each rail frame is fixed to the horizontal rack frames,
wherein the battery modules are not detached through an open side of the rack assembly.

10. The rack system for power storage battery modules according to claim 1, wherein each of the battery modules has a ventilating slot which allows air to flow between a top surface and a bottom surface thereof.

* * * * *